(12) United States Patent
Kim et al.

(10) Patent No.: US 8,084,696 B2
(45) Date of Patent: Dec. 27, 2011

(54) PRINTED CIRCUIT BOARD AND MANUFACTURING METHOD THEREOF

(75) Inventors: Tae-Gui Kim, Cheonggju-si (KR); Young-Hwan Shin, Daejeon (KR); Jae-Soo Lee, Cheongju-si (KR); Tae-Gon Lee, Daejeon (KR)

(73) Assignee: Samsung Electro-Mechanics Co., Ltd., Gyunggi-Do (KR)

(*) Notice: Subject to any disclaimer, the term of this patent is extended or adjusted under 35 U.S.C. 154(b) by 359 days.

(21) Appl. No.: 12/428,776

(22) Filed: Apr. 23, 2009

(65) Prior Publication Data

US 2010/0122842 A1    May 20, 2010

(30) Foreign Application Priority Data

Nov. 14, 2008 (KR) .......................... 10-2008-0113533

(51) Int. Cl.
*H05K 1/11* (2006.01)
(52) U.S. Cl. ........................................................ 174/262
(58) Field of Classification Search .......... 174/262–264; 361/97
See application file for complete search history.

(56) References Cited

U.S. PATENT DOCUMENTS

| | | | | |
|---|---|---|---|---|
| 4,170,819 A * | 10/1979 | Peter et al. | .......... | 29/853 |
| 5,689,091 A * | 11/1997 | Hamzehdoost et al. | ...... | 174/255 |
| 5,774,340 A | 6/1998 | Chang et al. | | |
| 5,796,163 A * | 8/1998 | Glenn et al. | .......... | 257/698 |
| 6,407,458 B1 * | 6/2002 | Huemoeller | .......... | 257/778 |
| 6,534,852 B1 | 3/2003 | Lin et al. | | |
| 7,342,320 B2 * | 3/2008 | Hedler et al. | ......... | 257/786 |

FOREIGN PATENT DOCUMENTS

| | | |
|---|---|---|
| DE | 699 37 153 T2 | 6/2008 |
| EP | 1 102 525 B1 | 9/2007 |
| JP | 2000-012991 A | 1/2000 |
| JP | 2003-142827 | 5/2003 |
| KR | 10-0719287 | 5/2007 |
| KR | 10-0726238 | 6/2007 |

OTHER PUBLICATIONS

German Office Action, w/ English translation thereof, issued in German Patent Application No. 10 2009 023 629.5-34 dated Dec. 16, 2009.
Korean Office Action, with partial English translation, issued in Korean Patent Application No. 10-2008-0113533, mailed Jul. 20, 2010.
Japanese Office Action, w/ partial English translation thereof, issued in Japanese Patent Application No. JP 2009-108507 dated May 31, 2011.

* cited by examiner

*Primary Examiner* — Phuong Dinh
(74) *Attorney, Agent, or Firm* — McDermott Will & Emery LLP

(57) ABSTRACT

A printed circuit board and a method of manufacturing the same are disclosed. The method of manufacturing a printed circuit board including a connecting layer configured to which is configured to electrically connect both sides of an insulator, and a pad part, electrically connect both sides of an insulator, and a pad part formed in one side of the insulator to be directly in contact with the connecting layer, includes: forming a seed layer part on one side of the insulator, a portion of the seed layer part being bulged, forming a via hole by processing the other side of the insulator, corresponding to the bulged portion of the seed layer part, forming the connecting layer inside the via hole, and forming a plating layer, corresponding to the pad part, on the seed layer part. A pattern having a finer pitch, maintaining a VOP structure, can be formed and a lower side of a substrate is not penetrated through when a via hole is processed.

6 Claims, 13 Drawing Sheets

PRINTED CIRCUIT BOARD AND MANUFACTURING METHOD THEREOF

CROSS-REFERENCE TO RELATED APPLICATIONS

This application claims the benefit of Korean Patent Application No. 10-2008-0113533, filed with the Korean Intellectual Property Office on Nov. 14, 2008, the disclosure of which is incorporated herein by reference in its entirety.

BACKGROUND

1. Technical Field

The present invention relates to a printed circuit board and a manufacturing method thereof.

2. Description of the Related Art

With the trend high-density, high-integrated circuit boards, a package is mounted on a substrate largely by using a line or a pad 3 and solder ball 4 formed in a lower side of a substrate 1, as shown in FIG. 1.

The structure shown in FIG. 1, however, requires a space for a via 2 and the pad 3, respectively. Accordingly, a VOP (via on pad) structure has been suggested as shown in FIG. 2, in which a via 7 penetrating through a substrate 5 formed with a circuit pattern 6 is directly connected to a pad 8, and a solder ball 9 is coupled to the pad 8.

When the VOP structure is formed, a via hole is often formed by using a laser drill. In case of a substrate in which metal films are formed, for example, a copper clad laminate, a lower metal film is penetrated through by the laser drill.

To solve such a problem, there has been an attempt to increase the thickness of the lower metal film. However, as the lower metal film becomes thicker, it becomes more difficult to form a fine circuit.

There has been another attempt to use less energy in the laser drill. However, the laser drill with less energy has not been efficient in forming the via hole.

SUMMARY

The present invention provides a printed circuit board and a method of manufacturing the printed circuit board that can prevent a lower substrate from being penetrated through and improve the process efficiency.

An aspect of present invention features a printed circuit board. The printed circuit board in accordance with an embodiment of the present invention can include an insulator, a connecting layer, which is configured to electrically connect both sides of the insulator, and a pad part, which is formed on one side of the insulator to be directly in contact with the connecting layer. The pad part can include a seed layer part, which is formed on one side of the insulator to be directly in contact with the connecting layer and stepped such that a portion corresponding to the connecting layer is bulged, and a plating layer, which is formed on the seed layer part.

A surface-treatment layer can be formed on the planting layer, and the area of the bulged portion can be equal to or greater than a cross-section of the connecting layer that is in contact with the seed layer part. that is in contact with the seed layer part.

Another aspect of present invention features a method of manufacturing a printed circuit board. The method of manufacturing a printed circuit board in accordance with an embodiment of the present invention can include forming a seed layer part on one side of the insulator, a portion of the seed layer part being bulged, forming a via hole by processing the other side of the insulator, corresponding to the bulged portion of the seed layer part, forming the connecting layer inside the via hole, and forming a plating layer, corresponding to the pad part, on the seed layer part.

The method can also include forming a surface-treatment layer on the plating layer, and the area of the bulged portion can be equal to or greater than a cross-section of the connecting layer that is in contact with the seed layer part.

DETAIL DESCRIPTION

Figure 1:
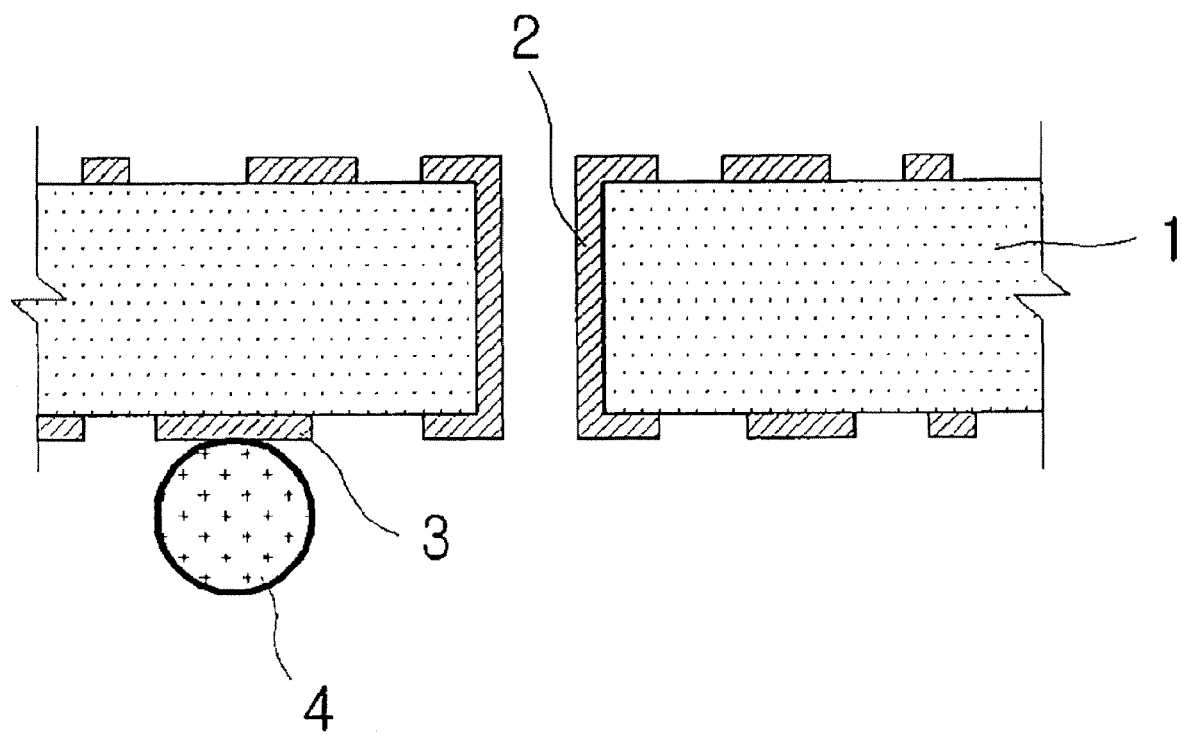
FIG. 1 and FIG. 2 are cross-sectional views showing the conventional printed circuit.
Figure 2:
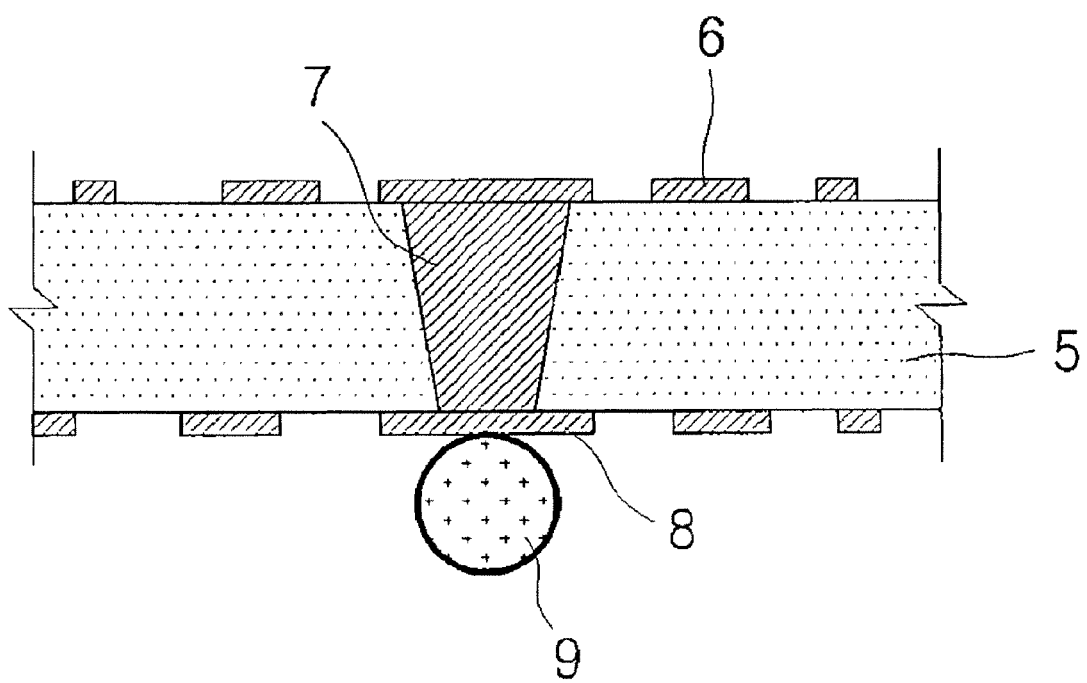

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Hereinafter, a printed circuit board and a method of manufacturing the printed circuit board according to an embodiment of the present invention will be described in detail with reference to the accompanying drawings. Identical or corresponding elements will be given the same reference numerals, regardless of the figure number, and any redundant description of the identical or corresponding elements will not be repeated.

Figure 3:
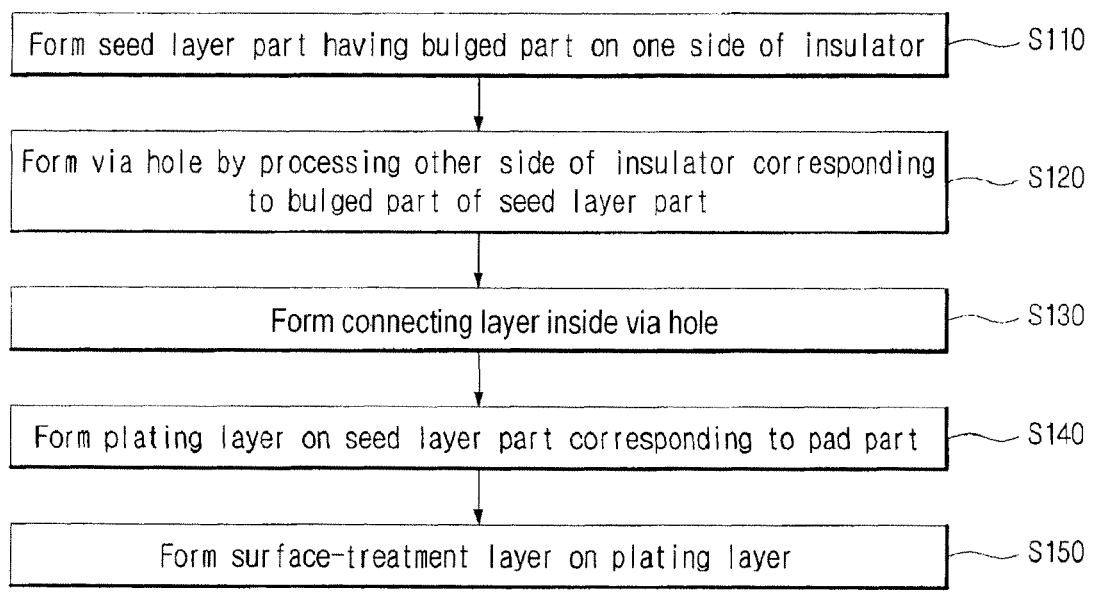
FIG. 3 is a flowchart showing a method of manufacturing a printed circuit board in accordance with an embodiment of the present invention.

Hereinafter, the method of manufacturing a printed circuit board in accordance with an embodiment of the present invention will be described first. FIG. 3 is a flowchart showing the method of manufacturing a printed circuit board in accordance with an embodiment of the present invention, and FIG. 4 through FIG. 9 show the processes of the method of manufacturing a printed circuit board in accordance with an embodiment of the present invention.

Shown in FIG. 4 through FIG. 9 are an insulator 10, metal layers 11 and 12, a seed layer part 11', an etching resist 13, a via hole 14, a connecting layer 15, patterns 20 and 21, pad parts 22, a solder resist 30 and a surface-treatment layer 40.

In the process represented by S110, the seed layer part 11' having a bulged portion 11b is formed on one side of the insulator 10. This will be described below in more detail.

Figure 4:
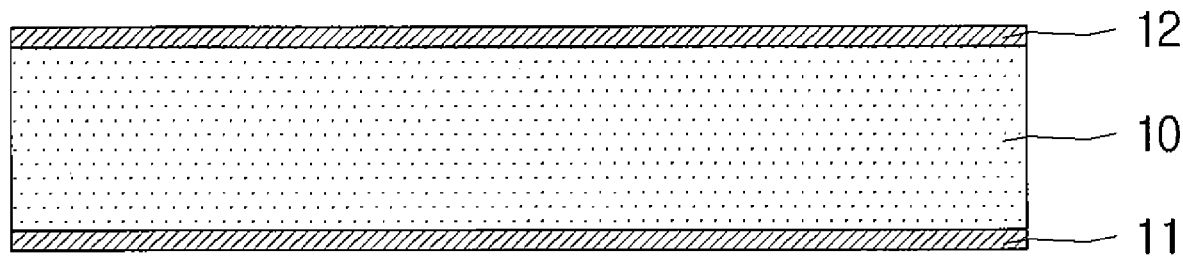
FIG. 4 through FIG. 9 show the processes of the method of manufacturing a printed circuit board in accordance with an embodiment of the present invention.

As shown in FIG. 4, a substrate, with the insulator 10 disposed in between the metal layers 11 and 12 such as copper foils, is prepared. A copper clad laminate can be used for the substrate.

Figure 5:
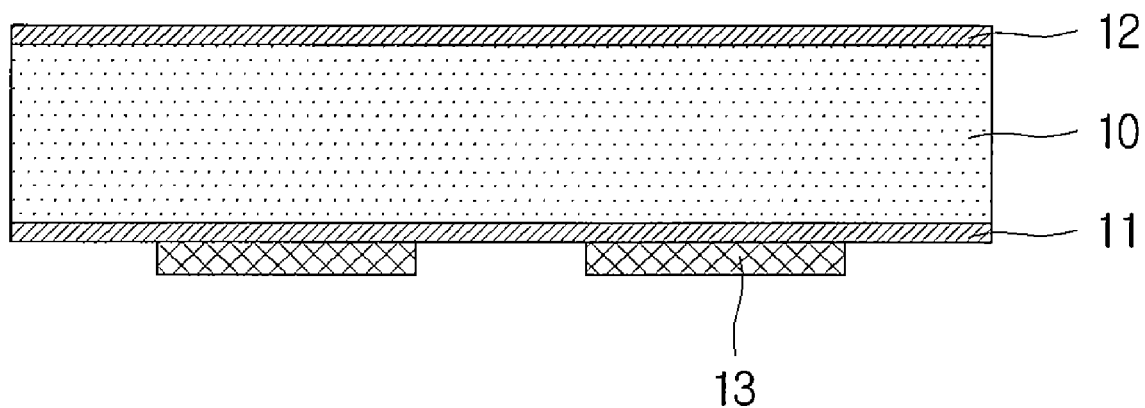

Then, the patterned etching resist 13 is formed on a lower side of the substrate, as shown in FIG. 5. The etching resist 13 can be formed by stacking a dry film on the substrate and then selectively exposing and developing the dry film.

Figure 6:
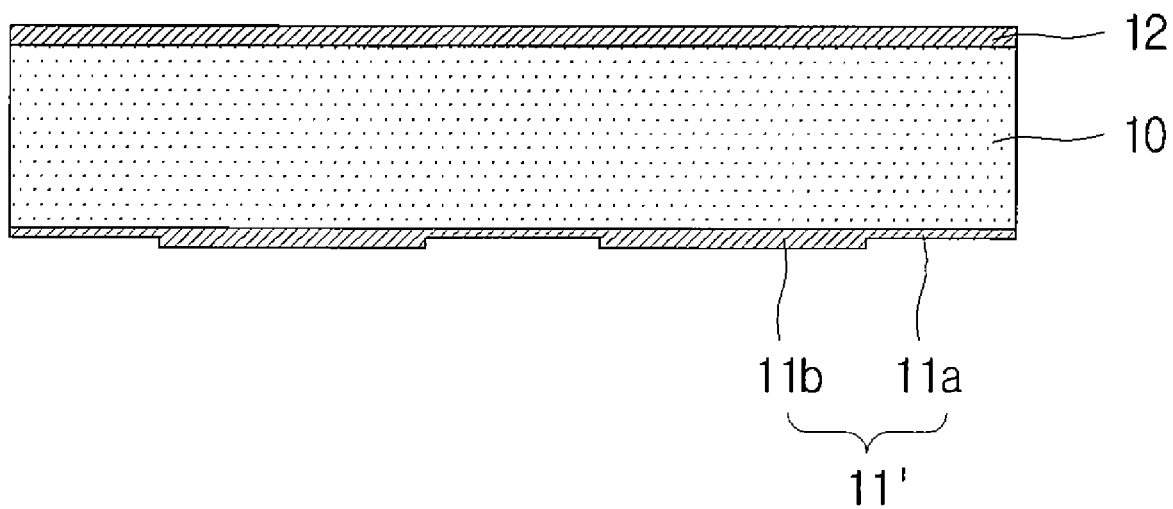

Next, the metal layer 11 is etched. At this time, the etching is sufficiently performed to keep the insulator 10 from being exposed, as shown in FIG. 6. That is, the etching is performed until the exposed metal layer 11 becomes thin enough.

Through the above processes, the seed layer part 11' can be formed on a lower side of the insulator 10 such that a portion 11b having been covered by the etching resist 13 is bulged.

Figure 7:
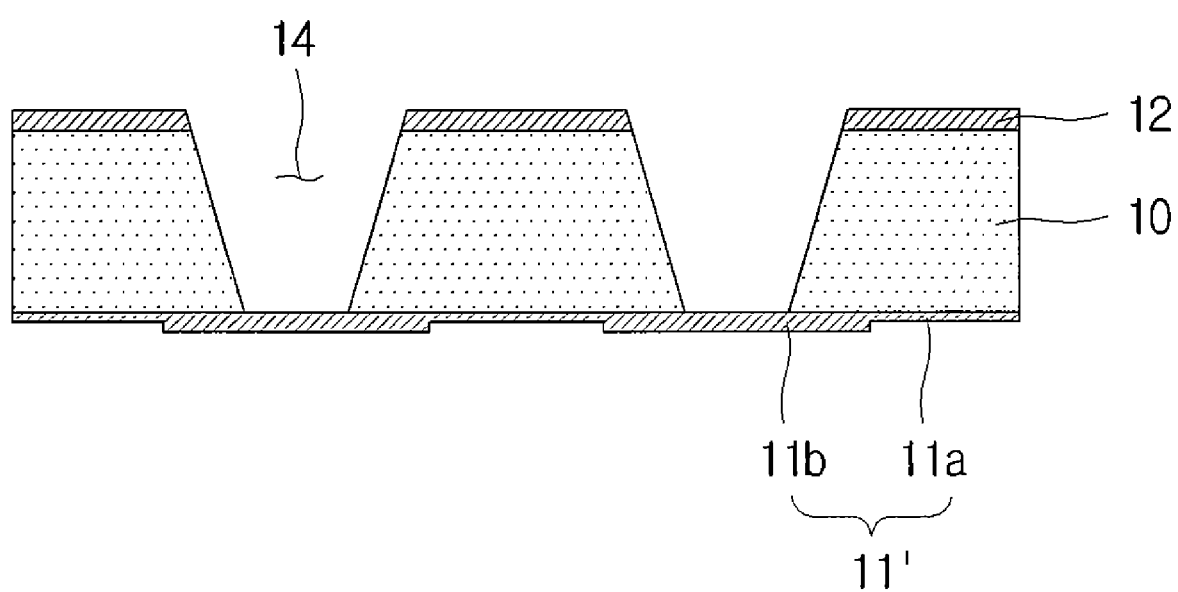

After the seed layer part 11' is formed, the via hole 14 is formed by processing the other side, i.e., the upper side, of the insulator 10, corresponding to the bulged portion 11b of the seed layer part 11', in the process represented by S120, as shown in FIG. 7. A laser drill can be used to form the via hole 14.

Since the portion 11b corresponding to the position to form the via hole 14 is bulged in the seed layer part 11' formed on the lower side of the insulator 10 in the present embodiment, it is less likely that the seed layer part 11' formed on the lower side of the insulator 10 is penetrated through in the process of forming the via hole 14 by using a laser drill. At this time, the possibility of penetrating through the seed layer part 11' can be further reduced if the bulged portion 11b is formed to be bigger than the cross-section of a lower side of the via hole 14.

Moreover, by selectively making the part 11b, in which the via hole 14 is to be processed, thicker than the other part 11a in the seed layer part 11', it is possible to form a fine pattern through a later plating process.

Figure 8:
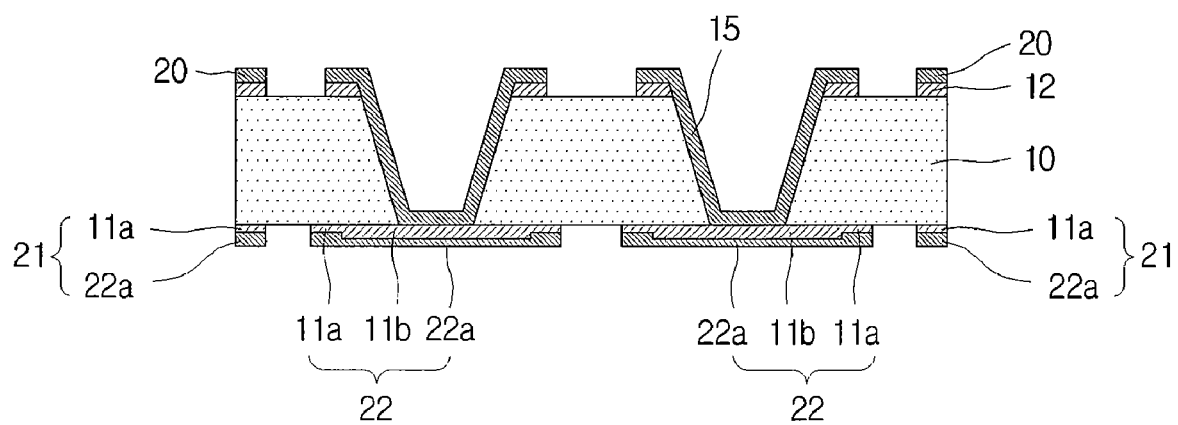

Then, as shown in FIG. 8, in the process represented by S130, the connecting layer 15 is formed inside the via hole 14, and a plating layer 22a is formed on the seed layer part 11', corresponding to the pad part 22, in the process represented by S140. A plating process can be used to form the connecting layer 15. In this case, the connecting layer 15 to be formed inside the via hole 14 and the plating layer 22a to be formed on the seed layer part 11' can be formed in the same process.

Although not illustrated in the drawing, the plating layer 22a can be formed on the seed layer part 11' by, in the order of, forming, electroplating and flash-etching a patterned plating resist (not shown) on the seed layer part 11', which is formed on the lower side of the insulator 10.

FIG. 8 shows the completely patterned connecting layer 15, circuit patterns 20 and 21 and pad part 22 through the above processes.

Figure 9:
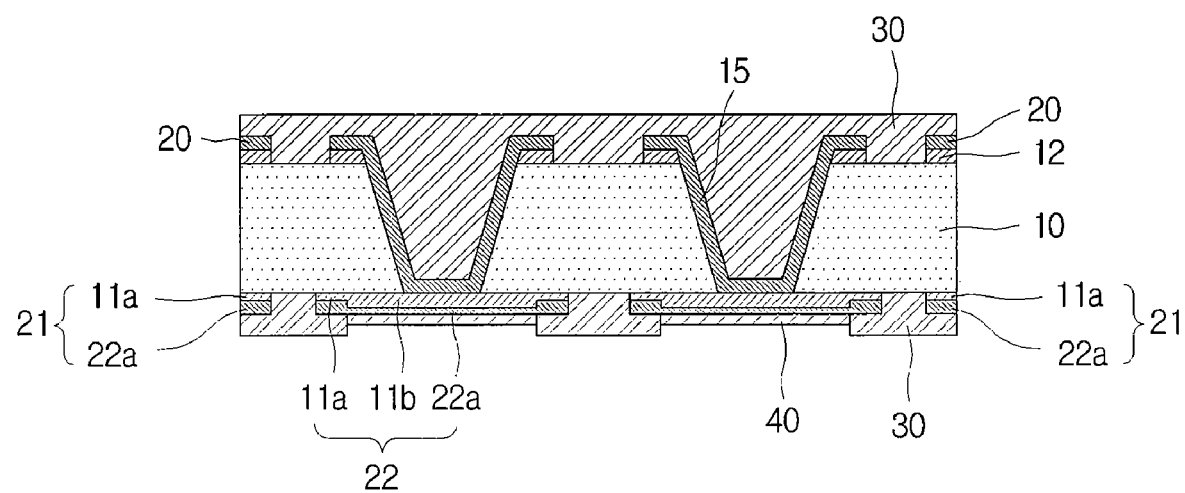

Then in the process represented by S150, the surface-treatment layer 40 is formed after covering the solder resist 30 on all areas except for some areas to be exposed, for example, the pad part 22 (refer to FIG. 9). That is, the surface-treatment layer 40 is formed on the pad part 22 where a solder ball is to be formed later. The surface-treatment layer 40 can be formed by plating nickel or gold.

Figure 10:
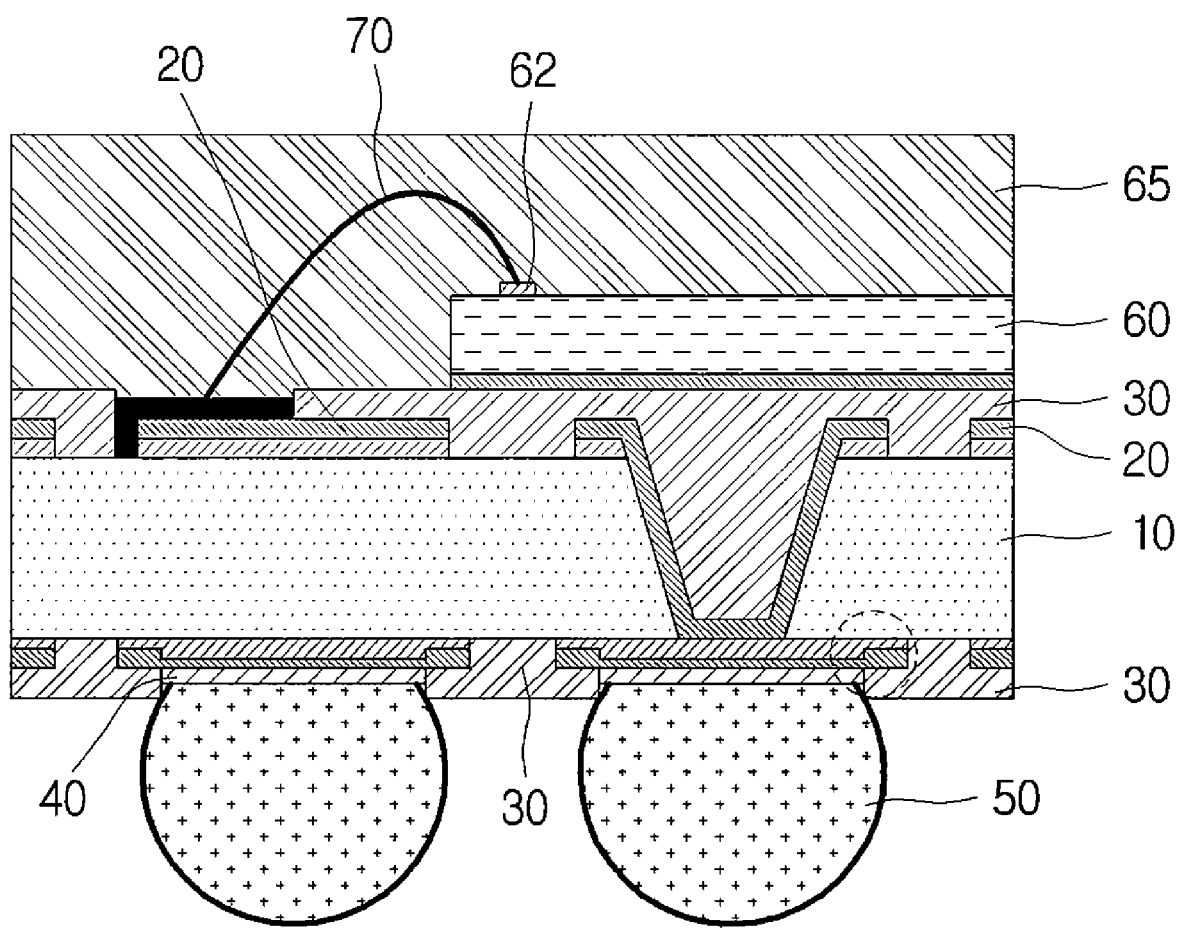
FIG. 10 is a cross-sectional view showing a package having a printed circuit board in accordance with an embodiment of the present invention.

FIG. 10 shows a package having the printed circuit board manufactured through the aforementioned processes. As shown in FIG. 10, the surface-treatment layer 40 is formed on the pad part 22 that is directly in contact with the connecting layer 15, and the solder ball 50 is formed on the surface-treatment layer 40. An electronic device 60, in which an electrode 62 is formed, is placed on an upper side of the printed circuit board and connected with, for example, the circuit pattern 20 through the line 70. The electronic device 60 can be covered by a molding part 65.

Although a thick metal layer is etched to form the seed layer part having a bulged portion in the aforementioned embodiment, it is also possible to plate on a thin metal film to form the seed layer part.

Figure 11:
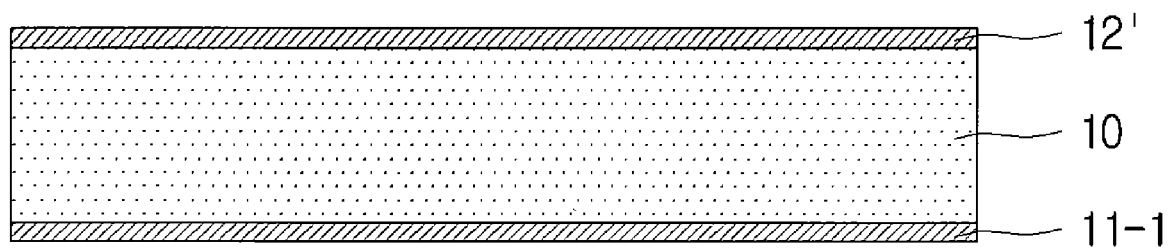
FIG. 11 through FIG. 13 show the processes of a method of manufacturing a printed circuit board in accordance with another embodiment of the present invention.
Figure 12:
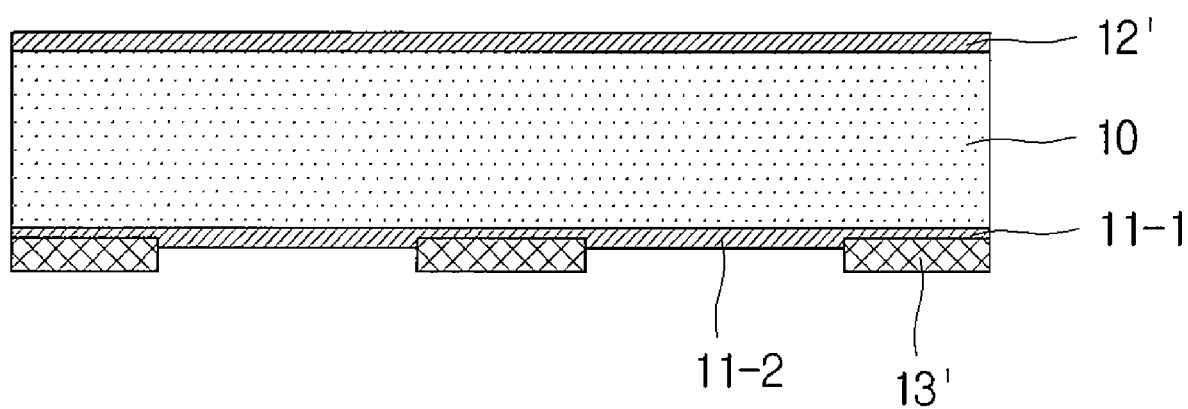
Figure 13:
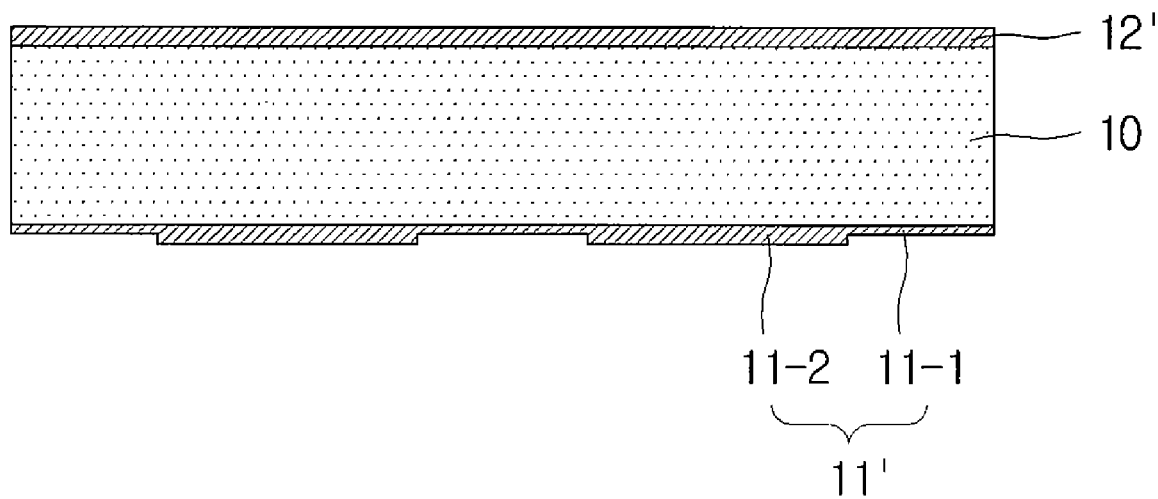

For example, after an insulator 10 having thin metal films 11-1 and 12' on either side is prepared as shown in FIG. 11, a patterned plating resist 13' can be formed on the lower-side metal film 11-1, as shown in FIG. 12. Then, the plating can be performed, and the plating resist 13' can be removed, as shown in FIG. 13.

Accordingly, similarly to the aforementioned embodiment of the present invention, it is also possible to form the seed layer part 11' having a bulged portion 11-2, in which a via hole is to be processed, through this method.

Since the processes to follow are identical to those of the aforementioned embodiment, the detailed descriptions will be omitted.

Hitherto, although some embodiments of the present invention have been shown and described, it will be appreciated by any person of ordinary skill in the art that a large number of modifications, permutations and substitutions are possible within the principles and spirit of the invention, the scope of the present invention shall be defined by the appended claims and their equivalents.

Many other embodiments can be included in the scope of claims of the present invention.

What is claimed is:

1. A printed circuit board, comprising:
   an insulator;
   a connecting layer configured to electrically connect both sides of the insulator; and
   a pad part formed on one side of the insulator to be directly in contact with the connecting layer,
   wherein the pad part comprises:
   a seed layer part, wherein the seed layer part is formed on one side of the insulator to be directly in contact with the connecting layer and the seed layer part includes a protruded portion such that the protruded portion corresponding to the connecting layer is bulged; and
   a plating layer formed on the seed layer part.

2. The printed circuit board of claim 1, further comprising a surface-treatment layer being formed on the plating layer.

3. The printed circuit board of claim 1, wherein an area of the bulged portion is equal to or greater than a cross-section of the connecting layer that is in contact with the seed layer part.

4. A method of manufacturing a printed circuit board including a connecting layer and a pad part, wherein the connecting layer is configured to electrically connect both sides of an insulator, and the pad part is formed on one side of the insulator to be directly in contact with the connecting layer, the method comprising:
   forming a seed layer part on one side of the insulator, wherein a portion of the seed layer part is bulged;
   forming a via hole by processing the other side of the insulator, corresponding to the bulged portion of the seed layer part;
   forming the connecting layer inside the via hole; and
   forming a plating layer on the seed layer part, the plating layer corresponding to the pad part.

5. The method of claim of 4, further comprising forming a surface-treatment layer on the plating layer.

6. The method of claim of 4, wherein an area of the bulged portion of the seed layer part is equal to or greater than a cross-section of the connecting layer that is in contact with the seed layer part.

* * * * *